(12) United States Patent
Shirakawa et al.

(10) Patent No.: US 7,153,584 B2
(45) Date of Patent: *Dec. 26, 2006

(54) HYBRID FILM, ANTIREFLECTION FILM COMPRISING IT, OPTICAL PRODUCT, AND METHOD FOR RESTORING THE DEFOGGING PROPERTY OF HYBRID FILM

(75) Inventors: Hiroshi Shirakawa, Tokyo (JP); Takeshi Mitsuishi, Tokyo (JP); Kenichi Shinde, Tokyo (JP)

(73) Assignee: Hoya Corporation, Tokyo (JP)

( * ) Notice: Subject to any disclaimer, the term of this patent is extended or adjusted under 35 U.S.C. 154(b) by 39 days.

This patent is subject to a terminal disclaimer.

(21) Appl. No.: 10/981,749

(22) Filed: Nov. 5, 2004

(65) Prior Publication Data
US 2005/0221079 A1 Oct. 6, 2005

Related U.S. Application Data

(63) Continuation of application No. 10/325,856, filed on Dec. 23, 2002, now Pat. No. 6,958,172.

(30) Foreign Application Priority Data
Dec. 28, 2001 (JP) ............................. 2001-399609

(51) Int. Cl.
*B32B 9/04* (2006.01)
(52) U.S. Cl. ...................... 428/448; 427/166; 427/167; 427/249.15; 427/255.14; 427/255.23; 427/255.28; 427/255.37; 427/255.18; 428/447; 528/25; 528/26; 528/29; 528/39; 523/169

(58) Field of Classification Search .................... None
See application file for complete search history.

(56) References Cited

U.S. PATENT DOCUMENTS

| 5,854,341 | A | * | 12/1998 | Yamamoto et al. | .......... | 524/767 |
| 5,858,526 | A | * | 1/1999 | Floch et al. | ................ | 428/327 |
| 5,976,680 | A | * | 11/1999 | Ikemori et al. | ............. | 428/212 |
| 2001/0031811 | A1* | | 10/2001 | Li et al. | ..................... | 524/262 |

FOREIGN PATENT DOCUMENTS

WO  WO 2004/076566  * 9/2004

* cited by examiner

*Primary Examiner*—Marc S. Zimmer
(74) *Attorney, Agent, or Firm*—Finnegan, Henderson, Farabow, Garrett & Dunner, LLP

(57) ABSTRACT

Hybrid films, such as those having good abrasion-resistance and defogging properties, antireflection films including it, optical products, and methods for restoring the defogging property of the hybrid films are disclosed. The hybrid films having a defogging property may be obtained through vapor deposition of an organic compound having a hydrophilic group and a reactive group along with silicon dioxide or with silicon dioxide and aluminum oxide. The antireflection film may be formed on a substrate having the hybrid film as the outermost layer opposite to the substrate. The optical product may comprise a plastic substrate and the antireflection film having the hybrid film. A method for restoring the defogging property of the hybrid film of the optical product may include washing the hybrid film.

17 Claims, No Drawings

HYBRID FILM, ANTIREFLECTION FILM COMPRISING IT, OPTICAL PRODUCT, AND METHOD FOR RESTORING THE DEFOGGING PROPERTY OF HYBRID FILM

CROSS-REFERENCE TO RELATED APPLICATION

This is a continuation of application Ser. No. 10/325,856, filed Dec. 23, 2002 now U.S. Pat. No. 6,958,172 and claims the benefit of Japanese Application No. 2001-399609, filed Dec. 28, 2001, all of which are incorporated herein by reference.

DESCRIPTION

1. Field of the Invention

The present invention relates to hybrid films, antireflection films comprising a hybrid film, optical products, and methods for restoring the defogging property of hybrid films. For example, the invention relates to hybrid films having good abrasion-resistance and defogging properties, antireflection films comprising the hybrid film, optical products, and methods for restoring the defogging property of the hybrid film.

2. Background of the Invention

Optical products having an antireflection film formed thereon through inorganic vapor deposition are known. These optical products, however, do not have good defogging properties.

To solve this problem, films having defogging and antireflection properties have been developed. For example, JP-T-10-510860 proposes a lens for glasses that is obtained by coating a lens substrate with a coating composition that contains a porous inorganic oxide and a specific siloxane oligomer to form thereon a defogging and antireflection film.

However, this defogging lens has poor abrasion resistance as compared with ordinary lenses for glasses that are coated with an antireflection film formed through ordinary vapor deposition. In addition, it has poor antireflection characteristics.

SUMMARY OF THE INVENTION

The present invention has been made to address the problems noted above. The present invention provides hybrid films that may have good abrasion-resistance and defogging properties, antireflection films comprising the hybrid film, optical products, and methods for restoring the defogging property of the hybrid film.

The present inventors have determined that optical products having good abrasion-resistance and defogging properties can be obtained by using a hybrid film formed through vapor deposition of at least one organic compound having a hydrophilic group and a reactive group along with silicon dioxide or with silicon dioxide and aluminum oxide.

Specifically, the invention provides hybrid films that may have a defogging property. A hybrid film is considered to have defogging property in the invention, if the hybrid film exhibits a contact angle to water lower than 10 degrees. The hybrid films may be obtained through vapor deposition of an organic compound having a hydrophilic group and a reactive group along with silicon dioxide or with silicon dioxide and aluminum oxide. The invention also provides antireflection films that comprise the hybrid film as the outermost layer of the antireflection film opposite to a substrate. The invention further provides optical products, such as glasses, that comprise a plastic substrate and the antireflection film having the hybrid film. Additionally, the present invention provides methods for restoring the defogging property of the hybrid film formed on the optical product, which methods comprise washing the hybrid film of the optical product. Furthermore, the invention provides methods of making hybrid films and optical products.

DESCRIPTION OF THE INVENTION

The particulars shown herein are by way of example and for purposes of illustrative discussion of the various embodiments of the present invention only. In this regard, no attempt is made to show details of the invention in more detail than is necessary for a fundamental understanding of the invention, the description making apparent to those skilled in the art how the several forms of the invention may be embodied in practice.

Unless otherwise stated, a reference to a compound or component, includes the compound or component by itself, as well as in combination with other compounds or components, such as mixtures of compounds.

The hybrid film of the invention is obtainable through vapor deposition of an organic compound having a hydrophilic group and a reactive group along with silicon dioxide or with silicon dioxide and aluminum oxide.

In that manner, the hybrid film of the invention contains a hydrophilic organic compound having a hydrophilic group in a layer of silicon dioxide or in a layer of silicon dioxide and aluminum oxide, in which the organic compound serves substantially as the hydrophilic group in a surface-active agent (surfactant) while, on the other hand, silicon oxide or the mixture of silicon oxide and aluminum oxide serves pseudo-actively as the hydrophobic group in a surfactant since its hydrophilicity is generally lower than that of the organic compound.

Since the hybrid film is generally obtained through vapor deposition, its thickness is easy to control. In addition, since the hybrid film is generally crosslinked due to the addition of the reactive organic substance to the inorganic $SiO_2$ layer, its abrasion resistance is usually good.

Typically, the hybrid film of the invention is obtained through vapor deposition according to an ion-assisted process in which the film is formed in a gaseous atmosphere. The ion-assisted process may be, for example, as described in FLIEDNER et al., "Plasma Ion Assisted Coating of Ophthalmic Optics," *Society of Vacuum Coaters*, Albuquerque, N.Mex., USA, pp. 237–241 (1995). In the ion-assisted process, the accelerating voltage may range from 50 V to 150 V, and the accelerating current may range from 30 mA to 100 mA. The ionizing gas in the ion-assisted process is generally argon (Ar) gas or a mixed gas of argon and oxygen in view of the reactivity with the organic compound and anti-oxidation in film formation therein.

In forming the hybrid layer, it is desirable that separate vapor deposition sources of inorganic and organic substances are simultaneously vaporized and deposited. The relative content of the organic substance can be controlled by varying the temperature and/or surface of the heating devices of the organic substance and/or of the inorganic substance. If the hybrid layer is to contain more than one inorganic substance or more than one organic substance, these are preferably vaporized in separate heating devices.

In one method of forming the hybrid film of the invention, one evaporation source of the organic compound and another evaporation source of silicon oxide or silicon oxide and aluminum oxide are prepared, and these are simultaneously evaporated and deposited in vacuum. For controlling the evaporation and deposition rate thereof, the organic compound may be diluted with a solvent and impregnated into a biocolumn filter. The content of the biocolumn is almost the same as the content of the column filter, however, the biocolumn filter is made so that a compound containing biomaterial does not react The impregnated filter is dried and then used as the organic compound source. In this case, the solvent is not specifically limited. For example, dimethyl ether can be used for amine-terminated organic compounds; ethyl acetate can be used for epoxide-terminated organic compounds; trimethylethylsilane or diethyl ether can be used for polysiloxane-type organic compounds of low polarity; and methanol can be used for polyether-type organic compounds of high polarity.

In cases where the organic compound to be used for forming the hybrid film of the invention is highly viscous and its boiling point is difficult or impossible to measure, a container of a porous material may be provided for it and heated. Accordingly, the intended film is formed on a substrate through vapor deposition of the organic compound from the porous container. By dissolving the organic substance in a solvent and controlling the amount of the resulting solution, the thickness of the film may be controlled. In addition, the solution may be impregnated into a porous material and heated to control the desired evaporation rate of the organic compound. More specifically, the porous material may be a sintered filter that may be prepared by sintering a metal powder of copper or the like of high thermal conductivity. The pore size of the porous material may range from 40 to 200 μm, such as from 80 to 120 μm, to attain a suitable evaporation rate of the organic compound. The container is generally heated to a range from 200 to 300° C., such as from 200 to 240° C., again to attain a suitable evaporation rate of the organic compound.

The heating device for use herein is not specifically limited. Examples include halogen heaters, resistance heaters, ceramic heaters, etc. The heating device is generally equipped with a shutter system for controlling film formation. Also, a jacket or the like for preventing the heated film-forming substance from scattering therearound to contaminate the substrate on which the film is formed may surround the heating device. For stable supply of the film-forming substance to the vapor deposition system, the biocolumn filter may be placed in an evaporation rate-controlling chamber with small holes, e.g., 2 to 10 cm, formed in its wall. The small holes may be oval to ensure better distribution orientation of the film-forming organic compound running through them.

In cases where the organic compound has a relatively low viscosity (for example, at most 15 cSt (0.000015 m²/s) at 25° C.) and its boiling point is easily determined, it may be put into an external tank heated at 50° C. to 150° C. and is evaporated and introduced into a vacuum chamber as a monomer gas, to form the intended film on a substrate. This is one mode of film formation with the organic compound of that type. In this case, the flow rate of the organic compound from the external tank can be directly controlled, such that the amount of the organic compound introduced into the vapor deposition system and the thickness of the film can be controlled.

The organic compound generally has an oxygen atom content of from 18 to 40 mol %, so that the hybrid film has improved defogging property. Also, the number average molecular weight of the organic compound may range from 150 to 1500 g/mol.

The amount of the organic compound to be used in the hybrid film of the invention generally ranges from 0.02 to 70% by weight of the hybrid film. The relative content of the organic compound may vary along the thickness direction of the hybrid film, but it may not be 0% or 100% at its surface. When the organic compound is applied with silicon dioxide, the amount of silicon dioxide generally ranges from 30 to 99.98% by weight of the hybrid film. When the organic compound is applied with silicon dioxide and aluminum oxide, the amount of silicon dioxide generally ranges from 30 to 99% by weight of the hybrid film and the amount of aluminum oxide generally ranges from 0.01 to 5% by weight of the hybrid film.

The amount of the organic substance in the hybrid layer in the film can be determined by, for example, determining the refractive indices of the inorganic substance and organic substance and measuring the film thickness of the hybrid layer and the reflectance thereof. The relative amount of the organic substance in the hybrid layer can then be determined by interpolation from the refractive index of the hybrid layer, using the refractive index of a layer consisting of the organic substance and the refractive index of a layer consisting of the inorganic substance as a basis.

The hydrophilic group and the reactive group may be connected in a variety of manners. For instance, the following formulas show how the connection may be made:

$$(Re—)_n Hy \text{ and } (Re\text{-}L\text{-})_n Hy \quad \text{(Ia) and (Ib)}$$

$$Re(\text{-}Hy)_m \text{ and } Re(\text{-}L\text{-}Hy)_m \quad \text{(IIa) and (IIb)}$$

$$(Re—)_n L(\text{-}Hy)_m \quad \text{(III)}$$

$$(Re—)_n Hy(\text{-}L)_o \quad \text{(IV)}$$

$$(L\text{-})_o—Re(\text{-}Hy)_m \quad \text{(V)}$$

wherein Re represents the reactive group, Hy represents the hydrophilic group, and L represents a (non-hydrophilic, non-reactive) linker that is a hydrocarbon moiety having 1 to 3 carbons. The parameter n is 1 or 2, m is an integer of 1 or more, and o is 1 or 2.

A group is considered to be a hydrophilic group according to the present invention, if the solubility of a compound that is derived from this group by attaching it to a methyl group, in water exceeds 90% (v/v). Examples of the hydrophilic group include —$SO_3H$, —$SO_3M$, —$OSO_3H$, —$OSO_3M$, —COOM, —$NR_3X$, —COOH, —$NH_2$, —CN, —OH, —$NHCONH_2$, —$(OCH_2CH_2)_p$—, —$CH_2OCH_3$, —$OCH_3$, —$COOCH_3$, —CS, or —CON (wherein R indicates an alkyl group having 1 to 2 carbon atoms, M indicates an alkali metal or $NH_4$, X indicates a halogen atom, and p indicates an integer of at least 1).

The organic compound containing the hydrophilic group may be a hydrophilic compound. Hydrophilicity is measured by the contact angle to water between a surface of a film, which is obtainable by curing the organic compound, and a drop of water. A compound is considered to be a hydrophilic compound if a film derived from this compound exhibits a contact angle to water lower than 10 degrees.

The organic compound often exhibits a higher hydrophilicity than the silicon dioxide and/or the aluminum oxide. In this case, the individual hydrophilicities are also determined and compared on the basis of the contact angles between films of the pure substances and a drop of water, as indicated above.

The reactive group of the organic compound for forming the hybrid layer is capable of reacting with itself or with the silicon dioxide and/or the aluminum oxide present in the hybrid layer. Examples of the reactive group include an epoxy group, a methacrylic group, an acrylic group, an amino group, a thiol group, a trialkoxysilyl group having from 3 to 15 carbon atoms, or a hydroxyl group.

The organic compound for forming the hybrid film of the invention may be a compound having a polyether backbone chain and a reactive group at both ends thereof, a compound having a chain of repetitive units of hydroxymethylene and having a reactive group at both ends thereof, or a compound having a chain of repetitive units of carboxymethylene and having a reactive group at both ends thereof.

Compounds having a polyether backbone chain and a reactive group at both ends thereof include those of the following general formula (1):

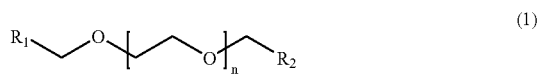
(1)

wherein $R_1$ and $R_2$ independently represent an epoxy group, a methacrylic group, an acrylic group, an amino group, a thiol group, a trialkoxysilyl group having from 3 to 15 carbon atoms, a hydroxyl group, or an organic group that contains at least one group selected from these groups; n indicates an integer of at least 1 such that the compound has a number average molecular weight that generally ranges from 150 to 1500 g/mol. The organic group that contains at least one group selected from these groups may be composed of a hydrocarbon group having 1 to 3 carbon atoms to which one or more of the functional groups listed above are attached.

Compounds having a chain of repetitive units of hydroxymethylene and having a reactive group at both ends thereof include those of the following general formula (2); and compounds having a chain of repetitive units of carboxymethylene and having a reactive group at both ends thereof include those of the following general formula (3):

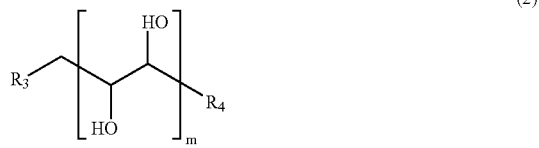
(2)

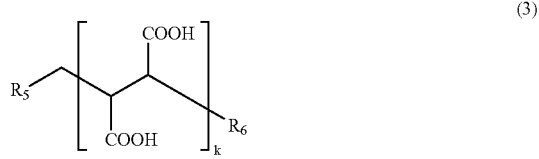
(3)

wherein $R_3$, $R_4$, $R_5$, and $R_6$ independently represent an epoxy group, a methacrylic group, an acrylic group, an amino group, a thiol group, a trialkoxysilyl group having from 3 to 15 carbon atoms, a hydroxyl group, or an organic group that contains at least one group selected from these; m and k represent integers of at least 2 such that the compound has a number average molecular weight that generally ranges from 225 to 1500 g/mol.

If desired, a crosslinking agent may be added to the organic compound that forms the hybrid film of the invention. Crosslinking agents include quaternary silanes such as tetraalkoxysilanes having 1 to 2 carbon atoms and tetraaminosilanes. The amount of the crosslinking agent generally ranges from 1 to 20% by weight of the organic compound.

The hybrid film of the invention may be used in a multi-layered antireflection film, serving as a low-refractivity layer thereof. Specifically, in a multi-layered antireflection film formed on a substrate, the hybrid film may be the outermost layer opposite to the substrate. The antireflection film and the optical product comprising it may have good abrasion resistance, defogging, and antireflection properties.

The thickness of the hybrid film of the invention is not specifically limited but may range from 5 to 100 nm. In cases where the hybrid film serves as the outermost low-reflectivity layer of a multi-layered antireflection film, its optical thickness may be on a level with the optical thickness ($\lambda/4$) of any known low-reflectivity layer of silicon dioxide or the like that may be in such a multi-layered antireflection film, wherein $\lambda$ represents the wavelength of the light applied. In that case, the refractive index of the hybrid film generally ranges from 1.42 to 1.48.

The hybrid film of the invention may be nearest to the substrate for ensuring good impact resistance of the coated substrate. When the hybrid film is positioned nearest to the substrate, an undercoat layer may be provided between the hybrid film and the substrate for enhancing the adhesiveness therebetween. The undercoat layer may be made of at least one metal having a catalytic action in forming the hybrid film thereon, for example, selected from nickel (Ni), silver (Ag), platinum (Pt), niobium (Nb), and titanium (Ti). Generally, the undercoat layer is a metal layer of niobium that ensures better impact resistance of the coated substrate. The undercoat layer of metal, if provided between the substrate and the hybrid film, improves the impact resistance of the coated substrate. While not wishing to be bound by theory, it is believed that the undercoat layer of metal may promote a crosslinking reaction of the film formed thereon.

To ensure the adhesiveness between the plastic substrate and the undercoat layer and to unify the initial condition of the hybrid film, the substrate may be pretreated with an ion gun before forming the undercoat layer. The ionizing gas for the ion gun pretreatment may be any of oxygen or argon (Ar), etc. The accelerating voltage of the ion gun may range from 50 V to 200 V and the accelerating current may range from 50 mA to 150 mA, for better adhesiveness between the substrate and undercoat layer, and for better abrasion resistance of the coated substrate.

The layers of the antireflection film other than the hybrid film are generally formed through vapor deposition. If desired, for example, they may be formed through physical vapor deposition (PVD), chemical vapor deposition (CVD), sputtering, ion plating, plasma CVD, or the like.

The layers of the antireflection film other than the hybrid film are not specifically limited. For better antireflection effect thereof, however, the antireflection film may comprise metal oxides, such as a low-refractivity layer of $SiO_2$ or a mixture of $SiO_2$ and $Al_2O_3$, and a high-refractivity layer of $Nb_2O_5$ or $TiO_2$.

The optical product of the invention, such as glasses, comprises a plastic substrate and an antireflection film including the hybrid film of the invention, formed on the plastic substrate.

The material of the plastic substrate for the optical product of the invention is not specifically limited, including, for example, methyl methacrylate homopolymers, copolymers of methyl methacrylate with at least one other monomer, such as a monomer having a vinyl group, diethylene glycol bisallylcarbonate homopolymers, copolymers of diethylene glycol bisallylcarbonate with at least one other monomer, such as a monomer having a vinyl group, sulfur-containing copolymers, halogen-containing copolymers, polycarbonates, polystyrenes, polyvinyl chlorides, unsaturated polyesters, polyethylene terephthalates, polyurethanes, and polythiourethanes.

The optical product of the invention may have a hard coat film between the plastic substrate and the antireflection film including the hybrid film, or between the plastic substrate and the undercoat layer.

The hard coat film is generally a composition that comprises metal oxide colloid particles and an organosilicon compound of the following general formula (I):

wherein $R_7$ and $R_8$ independently represent an organic group selected from an alkyl group having from 1 to 8 carbon atoms, an alkenyl group having from 2 to 8 carbon atoms, an aryl group having from 6 to 8 carbon atoms, an acyl group having from 1 to 8 carbon atoms, a halogen atom, a glycidoxy group, an epoxy group, an amino group, a mercapto group, a methacryloxy group and a cyano group; $R_9$ represents an organic group selected from an alkyl group having from 1 to 8 carbon atoms, an acyl group having from 1 to 8 carbon atoms, and an aryl group having from 6 to 8 carbon atoms; a and b are independently integers of 0 or 1.

The metal oxide colloid particles include, for example, those of tungsten oxide ($WO_3$), zinc oxide (ZnO), silicon oxide ($SiO_2$), aluminum oxide ($Al_2O_3$), titanium oxide ($TiO_2$), zirconium oxide ($ZrO_2$), tin oxide ($SnO_2$), beryllium oxide (BeO), and antimony oxide ($Sb_2O_5$). These metal oxides may be used either singly or in combination.

In general, the composition to be used to make the hard coat film may contain from 1 to 30% by weight of the metal oxide colloid particles based on the total weight of the composition, such as from 5 to 25% by weight.

Examples of the organosilicon compound of formula (I) include methyl silicate, ethyl silicate, n-propyl silicate, i-propyl silicate, n-butyl silicate, sec-butyl silicate, tert-butyl silicate, tetraacetoxysilane, methyltrimethoxysilane, methyltriethoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltrimethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethydimethoxysilane, β-glycidoxyethylmethyldiethoxysilane, α-glycidoxypropylmethyldimethoxysilane, α-glycidoxypropylmethyldiethoxysilane, β-glycidoxypropylmethyldimethoxysilane, β-glycidoxypropylmethyldiethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, γ-glycidoxypropylphenyldimethoxysilane, γ-glycidoxypropylphenyldiethoxysilane, ethyltrimethoxysilane, ethyltriethoxysilane, vinyltrimethoxysilane, vinyltriacetoxysilane, vinyltrimethoxyethoxysilane, phenyltrimethoxysilane, phenyltriethoxysilane, phenyltriacetoxysilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, γ-cyanoethyltriethoxysilane, chloromethyltrimethoxysilane, chloromethyltriethoxysilane, N-(β-aminoethyl)-γ-aminopropyltrimethoxysilane, N-(β-aminoethyl)-γ-aminopropylmethyldimethoxysilane, γ-aminopropylmethyldimethoxysilane, N-(β-aminoethyl)-γ-aminopropyltriethoxysilane, N-(β-aminoethyl)-γ-aminopropylmethyldiethoxysilane, dimethyldimethoxysilane, phenylmethyldimethoxysilane, dimethyldiethoxysilane, phenylmethyldiethoxysilane, γ-chloropropylmethyldiethoxysilane, γ-chloropropylmethyidiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptopropylmethyldiethoxysilane, methylvinyldimethoxysilane, and methylvinyldiethoxysilane.

The hard coat film may be formed by applying a coating composition onto the substrate. The coating composition may be prepared in any ordinary manner. If desired, the coating composition may contain a curing catalyst and any of various organic solvents and surfactants for improving the wettability of the substrate with the composition to thereby improve the surface smoothness of the hard coat film formed of the composition. Examples of curing catalysts include amines such as allylamine, ethylamine, etc.; various acids and bases including Lewis acids and Lewis bases, salts or metal salts with organic carboxylic acids, chromic acid, hypochlorous acid, boric acid, perchloric acid, bromic acid, selenious acid, thiosulfuric acid, orthosilicic acid, thiocyanic acid, nitrous acid, aluminic acid, carbonic acid or the like; as well as metal alkoxides with aluminium, zirconium, titanium or the like, and their metal chelate compounds. If further desired, it may contain any of UV absorbents, antioxidants, light stabilizers, anti-aging agents, etc., as long as the desired properties of the coating composition and hard coat film are achieved.

The coating composition may be applied onto the substrate by a coating method such as dipping, spin coating, or spraying. To improve face accuracy or the evenness of the surface of the film formed of the composition, dipping or spin coating is generally used.

After application to the substrate, the composition may be cured by drying it in hot air or by exposing it to active energy rays. In general, it is cured in hot air at 70 to 200° C., such as at 90 to 150° C. Examples of active energy rays include far-infrared rays, which suppress heat damage of the film.

The optical product of the invention has a defogging property, but its defogging property is not permanent. When the defogging property of the optical product has deteriorated, it can be restored by washing the hybrid film of the optical product.

The film may be washed through a plasma treatment. The plasma treatment comprises plasma discharge that leads to molecular dissociation to give excited molecules, radicals and ions, to which the intended subject is exposed. The duration of plasma irradiation of the film is not specifically limited, but generally ranges from 5 seconds to 60 seconds.

The hybrid film of the invention is generally transparent, its abrasion resistance and defogging property are typically good, and its reflectance is generally low. As a result, the hybrid film is useful in antireflection films, such as for optical products. In addition, even when the defogging property of the hybrid film has deteriorated, it can be readily restored to its original condition according to the method for restoring the defogging property of the hybrid films of the invention.

The present invention will be further illustrated by way of the following Examples. These Examples are non-limiting and do not restrict the scope of the invention.

EXAMPLES

The physical properties of the optical products obtained in the Examples were evaluated as follows:

(1) Luminous Transmittance:

Using a Hitachi spectrophotometer U-3410, the luminous transmittance, Y, of samples of plastic lenses having an antireflection film formed on both surfaces was measured.

(2) Luminous Reflectance:

Using the Hitachi spectrophotometer U-3410, the luminous reflectance, Z, of samples of plastic lenses having an antireflection film formed on both surfaces was measured.

(3) Film Adhesiveness:

Using a cutting tool, the surface of each plastic lens was cut to have 100 cross-cuts of 1 mm×1 mm each. An adhesive tape, Cellotape (Trade name, sold by Nichiban Corp.), was stuck on its cross-cut area, and rapidly peeled off. The number of the cross-cuts having remained on the lens was counted and shown in the following Tables, in which (number of cross-cuts remained)/100 indicates the film adhesiveness.

(4) Abrasion Resistance:

The surface of each plastic lens was rubbed with standard steel wool #0000 produced by Japan Steel Wool Corp., under a load of 1 kgf/cm$^2$ applied thereto. After 10 strokes of rubbing, the surface condition of each plastic lens was visually checked. The plastic lenses thus tested were evaluated according to the following criteria:

UA: Scratched little.
A: A few thin scratch marks found.
B: Many thin scratch marks and a few thick scratch marks found.
C: Many thin and thick scratch marks found.
D: Almost completely peeled.

(5) Defogging Property:

The samples were stored in a refrigerator at 5° C. for 20 minutes, then immediately transferred into a thermostat having a relative humidity of 90% and a temperature of 40° C. and left therein for 10 seconds. Each sample was then checked for the degree of haze, and evaluated according to the following criteria:

Level 4: Wearing the lens, one can read a book.
Level 3: Wearing the lens, one can walk in the daytime.
Level 2: Wearing the lens, one can see some surroundings.
Level 1: Wearing the lens, one cannot see the surroundings at all.

Samples of Levels 1 and 2 are not considered to have a defogging property.

(6) Measuring Contact Angle to Water

The contact angle to water of the surface of the plastic lens was measured by a K12 Automatic surface tension balance (made by Kruess Corp.), which used Wilhelmy's method.

Examples 1 and 2

90 parts by weight of colloidal silica (Snowtex-40 from Nissan Chemical), 81.6 parts by weight of methyltrimethoxysilane (organosilicon compound), 176 parts by weight of γ-glycidoxypropyltrimethoxysilane (organosilicon compound), 2.0 parts by weight of 0.5 N hydrochloric acid, 20 parts by weight of acetic acid, and 90 parts by weight of water were put into a glass reactor, and stirred at room temperature for 8 hours. The resulting solution was left at room temperature for 16 hours to form a hydrolyzed solution. To this solution were added 120 parts by weight of isopropyl alcohol, 120 parts by weight of n-butyl alcohol, 16 parts by weight of aluminum acetylacetone, 0.2 parts by weight of silicone surfactant (polyalkylene oxide methylsiloxane copolymer, trade name: Y 7006, produced by Nippon Unicar Company Ltd.), and 0.1 parts by weight of UV absorbent (2-2(hydroxy4-octhyloxyphenyl) benzotriazole, trade name: SEESORB 707R, produced by SHIPORRO Corp.). The mixture was stirred at room temperature for 8 hours, and then aged at room temperature for 24 hours to form a coating solution.

A plastic lens substrate (made of diethylene glycol bisallyl carbonate, and having a refractive index of 1.50, a center thickness of 2.0 mm and a power of 0.00) was pretreated with an aqueous alkali solution (0.1 N NaOH). This was dipped in the coating solution. After completion of dipping, the plastic lens was taken out at a pulling rate of 20 cm/min. Then, the plastic lens was heated at 120° C. for 2 hours. In that manner, the plastic lens substrate was coated with a hard coat film (hard coat layer A). Next, the resulting plastic lens was subjected to ion gun pretreatment with Ar gas under the conditions shown in Table 1 below.

Next, under the conditions shown in Table 1, a multi-layered antireflection film composed of 1st to 7th layers was formed on the hard coat layer A to obtain plastic lenses.

As shown in Table 1, the organic compound having a hydrophilic group and a reactive group used in Example 1 was an organic substance A (polyethylene glycol glycidyl ether, E-400 from Nippon Yushi Corp.); and that used in Example 2 was an organic substance B (polyethylene glycol monoacrylate, AE-400 from Nippon Yushi Corp.).

In forming the multi-layered antireflection film, its 7th layer of hybrid film was formed according to an ion-assisted process using an ion gun (manufactured by Shincron Corp., model number: RIS-120D). In the process of Example 1, Ar gas was used, the accelerating voltage was 70 V, and the accelerating current was 70 mA. The organic substance A was put in an external tank heated at 80° C. and placed into a vapor deposition chamber having a reduced pressure of $5\times10^{-5}$ Torr, while the inorganic component, as shown in Table 1, was supplied simultaneously from a single source thereinto through evaporation by means of an ion gun to form a hybrid film thereon. The condition of the evaporation and deposition of the inorganic substance and the organic substance was controlled so that they were almost simultaneously deposited on the substrate as bideposition.

The plastic lenses thus obtained were evaluated according to the test methods (1) to (5) mentioned above, and the results are shown in Table 1. In the Table, λ indicates the wavelength of light applied to the samples, and λ=500 nm. The refractive index of the hybrid layer was measured at λ=500 nm.

Example 3

A hard coat layer A was formed on a substrate in the same manner as in Example 1. Next, under the conditions shown in Table 2, a multi-layered antireflection film composed of 1st to 7th layers was formed on the hard coat layer A to obtain a plastic lens.

As shown in Table 2, the organic compound having a hydrophilic group and a reactive group used in Example 3 was an organic substance C (N-(3-trimethoxysilylpropyl) gluconamide from Chisso Corp.).

In forming the multi-layered antireflection film, the hybrid film comprising the 7th layer was formed according to an ion-assisted process using an ion gun. In this process, Ar gas was used, the accelerating voltage was 80 V, and the accelerating current was 80 mA. The organic substance C was dissolved in a solvent, ethyl acetate, to prepare a 50% solution thereof. 0.5 ml of the solution was impregnated into a biocolumn (stainless steel filter of 18 mm diameter and 3 mm thickness, having a pore size of from 80 to 100 μm). The biocolumn was set in a deposition chamber having a vacuum of $5\times10^{-5}$ Torr ($6.7\times10^{-3}$ Pa) and heated at 150 to 200° C. therein, while the inorganic component was evaporated simultaneously by means of the electron gun to form a hybrid film. The condition of the evaporation and deposition of the inorganic substance and the organic substance was controlled so that they were almost simultaneously deposited on the substrate as bideposition.

The plastic lens thus obtained was evaluated according to the test methods (1) to (5) mentioned above, and the results are shown in Table 4. In Table 3, λ indicates the wavelength of light applied to the samples, and λ=500 nm. The refractive index of the hybrid layer was measured at λ=500 nm.

Layers that were produced without an ion assisted process are indicated in the following Tables by the sign "–" in the column "Ion gun Setting." These layers were deposited through conventional vapor deposition.

TABLE 1

|  | Example 1 | Example 2 |
|---|---|---|
| Plastic Lens Substrate | diethylene glycol bisallyl carbonate | diethylene glycol bisallyl carbonate |
| Hard Coat Layer | Layer A | Layer A |
| Setting for Ion Gun Pretreatment | accelerating voltage 200 V, accelerating current 100 mA | accelerating voltage 200 V, accelerating current 100 mA |
| Gas used | Ar | Ar |

|  | Type of Film, Film Thickness | Ion gun Setting | Type of Film, Film Thickness | Ion gun Setting |
|---|---|---|---|---|
| 1st Layer | $SiO_2 + Al_2O_3$, 0.25 λ<br>layer refractive index, 1.486 | 100 V, 70 mA<br>Ar gas | $SiO_2 + Al_2O_3$, 0.25 λ<br>layer refractive index, 1.486 | 100 V, 70 mA<br>Ar gas |
| 2nd Layer | $Nb_2O_5$, 0.038 λ | 350 V, 130 mA<br>$O_2$/Ar, 8/2 | $Nb_2O_5$, 0.041 λ | 350 V, 130 mA<br>$O_2$/Ar, 8/2 |
| 3rd Layer | $SiO_2 + Al_2O_3$, 0.121 λ<br>layer refractive index, 1.486 | — | $SiO_2 + Al_2O_3$, 0.122 λ<br>layer refractive index, 1.486 | 100 V, 70 mA<br>Ar gas |
| 4th Layer | $Nb_2O_5$, 0.164 λ | 350 V, 130 mA<br>$O_2$/Ar, 8/2 | $Nb_2O_5$, 0.170 λ | 350 V, 130 mA<br>$O_2$/Ar, 8/2 |
| 5th Layer | $SiO_2 + Al_2O_3$, 0.059 λ<br>layer refractive index, 1.486 | — | $SiO_2 + Al_2O_3$, 0.055 λ<br>layer refractive index, 1.486 | 100 V, 70 mA<br>Ar gas |
| 6th Layer | $Nb_2O_5$, 0.180 λ | 350 V, 130 mA<br>$O_2$/Ar, 8/2 | $Nb_2O_5$, 0.187 λ | 350 V, 130 mA<br>$O_2$/Ar, 8/2 |
| 7th Layer | $SiO_2 + Al_2O$ + organic substance A, 0.276 λ<br>layer refractive index, 1.465<br>$SiO_2 + Al_2O_3$ = 1.486<br>content of organic substance, about 10 to 15 wt. % | 70 V, 70 mA<br>Ar gas | $SiO_2 + Al_2O_3$ + organic substance B, 0.266 λ<br>layer refractive index, 1.462<br>$SiO_2 + Al_2O_3$ = 1.486<br>content of organic substance, about 10 to 15 wt. % | 100 V, 70 mA<br>Ar gas |
| Organic Substance used | A: polyethylene glycol glycidyl ether, Nippon Yushi's E-400 | | B: polyethylene glycol monoacrylate, Nippon Yushi's AE-400 | |

TABLE 2

Evaluation of Plastic Lens Properties

|  | Example 1 | Example 2 |
|---|---|---|
| Luminous Reflectance, Y % | 0.81% | 0.72% |
| Luminous Transmittance, Z % | 99.0% | 99.1% |
| Film Adhesiveness | 100/100 | 100/100 |
| Abrasion Resistance | UA | UA |
| Defogging property | 4 | 4 |

TABLE 3

Example 3

| | |
|---|---|
| Plastic Lens Substrate | diethylene glycol bisallyl carbonate |
| Hard Coat Layer | Layer A |
| Setting for Ion Gun Pretreatment | accelerating voltage 200 V, accelerating current 100 mA |
| Gas used | Ar |

| | Type of Film, Film Thickness | Ion gun Setting |
|---|---|---|
| 1st Layer | 0.25 λ<br>$SiO_2 + Al_2O_3 = 1.486$ | 100 V, 70 mA<br>Ar gas |
| 2nd Layer | $Nb_2O_5$, 0.038 λ | — |
| 3rd Layer | $SiO_2 + Al_2O_3$<br>0.121 λ | — |
| 4th Layer | $Nb_2O_5$, 0.164 λ | — |
| 5th Layer | $SiO_2 + Al_2O_3$<br>0.059 λ | — |
| 6th Layer | $Nb_2O_5$, 0.180 λ | — |
| 7th Layer | $SiO_2 + Al_2O_3$ + organic substance C,<br>0.267 λ<br>layer refractive index, 1.465<br>$SiO_2 + Al_2O_3 = 1.486$<br>organic substance C = 1.427,<br>content of organic substance,<br>about 6 to 10 wt % | 80 V, 80 mA<br>Ar gas |
| Organic Substance used | C: N-(3-trimethoxysilylpropyl)gluconamide<br>(from Chisso) | |

TABLE 4

Evaluation of Plastic Lens Properties

| | Example 3 |
|---|---|
| Luminous Reflectance, Y % | 0.81% |
| Luminous Transmittance, Z % | 99.0% |
| Film Adhesiveness | 100/100 |
| Abrasion Resistance | UA |
| Defogging property | 4 |

As shown in Tables 1 to 4, the plastic lenses of Examples 1 to 3 all have an extremely small luminous reflectance of from 0.72 to 0.81% and have a large luminance transmittance of from 99.0 to 99.1%. In addition, their film adhesiveness, abrasion resistance, and defogging property are all good.

The contact angles to water of the lenses of Examples 1 to 3 were as follows: Example 1 was 5 degrees, Example 2 was 4 degrees, and Example 3 was 5 degrees. Thus, the contact angle to water indicates that these lenses have defogging property.

Example 4

The antireflection film of each defogging plastic lens produced in Examples 1 to 3, in which the outermost layer of the antireflection film was a hybrid film of the invention, was rubbed with chamois leather under a load of 100 g. After 200 strokes of rubbing, the defogging property of each lens lowered to level 2, and the contact angles to water of the lenses of Examples 1 to 3 were 16 degrees (Example 1), 15 degrees (Example 2), and 16 degrees (Example 3). After that, the lenses were placed in the chamber of a laboratory plasma generator (manufactured by Shincron Corp., model number PEC-1100-2), and the chamber was then degassed to have a reduced pressure of 1 Torr (133 Pa). Next, air was introduced into the chamber at a flow rate of 70 cc/min (based on volume at 25° C.), and the lenses therein were subjected to air plasma treatment with an RF (radiofrequency) power of 200 W for 15 seconds. Through the treatment, all the plastic lenses of Examples 1 to 3 were restored to their original defogging property condition, and other properties were not damaged. Thus restored, the defogging property of all these lenses increased to level 4, and the contact angles to water of the lenses of Examples 1 to 3 were 5 degrees (Example 1), 4 degrees (Example 2), and 5 degrees (Example 3).

While the invention has been described in connection with certain embodiments so that aspects thereof may be more fully understood and appreciated, it is not intended to limit the invention to these particular embodiments. On the contrary, it is intended to cover all alternatives, modifications and equivalents as may be included within the scope of the invention as defined by the appended claims.

What is claimed is:

1. An optical product comprising a plastic substrate, an antireflection film and a hard coat film between the plastic substrate and the antireflection film, wherein the antireflection film comprises a hybrid film obtained through vapor deposition of at least one organic compound having a hydrophilic group and a reactive group and having a number average molecular weight ranging from 150 to 1500 g/mol. along with silicon dioxide or with a combination of silicon dioxide and aluminum oxide.

2. The optical product of claim 1, wherein the hybrid film is obtained through an ion-assisted process.

3. The optical product of claim 1, wherein the organic compound has an oxygen content of from 18–40 mol. %.

4. The optical product of claim 1, wherein the amount of organic compound ranges from 0.02–70% by weight of the hybrid film.

5. The optical product of claim 1, wherein the hybrid film has a thickness of from 5–100 nm.

6. The optical product of claim 1 further including a metal undercoat layer having a catalytic action in the formation of the hybrid layer.

7. The optical product of claim 6, wherein the metal is niobium.

8. The optical product of claim 7, wherein the hard coat film is made from a composition comprising metal oxide colloid particles and an organosilicon compound of the following general formulation (I):

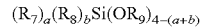

$(R_7)_a(R_8)_b Si(OR_9)_{4-(a+b)}$ wherein $R_7$ and $R_8$ independently represent an organic group selected from an alkyl group having from 1 to 8 carbon atoms, an alkenyl group having from 2 to 8 carbon atoms, an aryl group having from 6 to 8 carbon atoms, an acyl group having from 1 to 8 carbon atoms, a halogen atom, a glycidoxy group, an epoxy group, an amino group, a mercapto group, a methacryloxy group and a cyano group; $R_9$ represents an organic group selected from an alkyl group having from 1 to 8 carbon atoms, an acyl group having from 1 to 8 carbon atoms, and an aryl group having from 6 to 8 carbon atoms; and a and b are independently integers of 0 or 1.

9. The optical group of claim 8, wherein the metal oxide colloid particles include at least one selected from the group of tungsten oxide, zinc oxide, silicon oxide, aluminum oxide, titanium oxide, zirconium oxide, tin oxide, beryllium oxide, and antimony oxide.

10. The optical product of claim 9, wherein the metal oxide is present in an amount of 5 to 25% by weight of the hard coat film.

11. The optical product of claim 10, wherein the metal oxide is colloidal silica.

12. The optical product of claim 11, wherein the hybrid layer forms an outermost layer of the antireflection film opposite to the plastic substrate.

13. The optical product of claim 12, wherein the hybrid film exhibits a contact angle to water lower than 10 degrees.

14. The optical product of claim 13, wherein the hybrid film is obtained through vapor deposition of a combination of silicon dioxide and aluminum oxide.

15. The optical product of claim 14, wherein the plastic substrate is diethylene glycol bisallyl carbonate.

16. An optical product comprising a plastic substrate, an antireflection film and a hard coat film between the plastic substrate and the antireflection film, wherein the antireflection film comprises a hybrid film obtained through vapor deposition of at least one organic compound and having a hydrophilic group and a reactive group along with silicon dioxide or with a combination of silicon dioxide and aluminum oxide, wherein the hard coat film comprises metal oxide colloid particles and an organosilicon compound of the following general formulation (I):

$$(R_7)_a(R_8)_b Si(OR_9)_{4-(a+b)}$$

wherein $R_7$ and $R_8$ independently represent an organic group selected from an alkyl group having from 1 to 8 carbon atoms, an alkenyl group having from 2 to 8 carbon atoms, an aryl group having from 6 to 8 carbon atoms, an acyl group having from 1 to 8 carbon atoms, a halogen atom, a glycidoxy group, an epoxy group, an amino group, a mercapto group, a methacryloxy group and a cyano group; $R_9$ represents an organic group selected from an alkyl group having from 1 to 8 carbon atoms, an acyl group having from 1 to 8 carbon atoms, and an aryl group having from 6 to 8 carbon atoms; and a and b are independently integers of 0 or 1.

17. An optical product comprising a plastic substrate, an antireflection film and a hard coat film between the plastic substrate and the antireflection film, wherein the antireflection film comprises a hybrid film obtained through vapor deposition of at least one organic compound having a hydrophilic group and a reactive group along with silicon dioxide or with a combination of silicon dioxide and aluminum oxide, wherein the at least one organic compound comprises a compound having a polyether backbone chain and a reactive group at both ends of the polyether backbone chain.

* * * * *